(12) United States Patent
Delacruz et al.

(10) Patent No.: US 11,916,076 B2
(45) Date of Patent: Feb. 27, 2024

(54) DEVICE DISAGGREGATION FOR IMPROVED PERFORMANCE

(71) Applicant: Adeia Semiconductor Inc., San Jose, CA (US)

(72) Inventors: Javier A. Delacruz, San Jose, CA (US); Don Draper, San Jose, CA (US); Jung Ko, San Jose, CA (US); Steven L. Teig, Menlo Park, CA (US)

(73) Assignee: Adeia Semiconductor Inc., San Jose, CA (US)

( * ) Notice: Subject to any disclaimer, the term of this patent is extended or adjusted under 35 U.S.C. 154(b) by 296 days.

(21) Appl. No.: 16/915,140

(22) Filed: Jun. 29, 2020

(65) Prior Publication Data
US 2020/0403006 A1 Dec. 24, 2020

Related U.S. Application Data

(63) Continuation of application No. 16/156,506, filed on Oct. 10, 2018, now Pat. No. 10,700,094.

(60) Provisional application No. 62/715,966, filed on Aug. 8, 2018.

(51) Int. Cl.
*H01L 25/065* (2023.01)
*H01L 25/00* (2006.01)
*H01L 27/118* (2006.01)

(52) U.S. Cl.
CPC .... *H01L 27/11807* (2013.01); *H01L 25/0652* (2013.01); *H01L 25/0657* (2013.01); *H01L 25/50* (2013.01); *H01L 2027/11838* (2013.01); *H01L 2027/11875* (2013.01); *H01L 2027/11879* (2013.01); *H01L 2027/11881* (2013.01)

(58) Field of Classification Search
None
See application file for complete search history.

(56) References Cited

U.S. PATENT DOCUMENTS

| 9,263,379 | B2 | 2/2016 | Young |
| 10,742,217 | B2 | 8/2020 | Dabral et al. |
| 2003/0211705 | A1* | 11/2003 | Tong ................. H01L 25/0657 438/455 |

(Continued)

OTHER PUBLICATIONS

Sperling, Ed. "Tech Talk: 14nm and Stacked Die" blog post Nov. 11, 2015 available online at https://semiengineering.com/tech-talk-14nm-and-stacked-die/ as well as separately the linked Youtube video "14nm and Stacked Die (2015)" available at https://www.youtube.com/ watch?v=ukTRuedB7ZU (Year: 2015).*

(Continued)

*Primary Examiner* — Grant S Withers
(74) *Attorney, Agent, or Firm* — Haley Guiliano LLP

(57) ABSTRACT

The present disclosure provides chip architectures for FPGAs and other routing implementations that provide for increased memory with high bandwidth, in a reduced size, accessible with reduced latency. Such architectures include a first layer in advanced node and a second layer in legacy node. The first layer includes an active die, active circuitry, and a configurable memory, and the second layer includes a passive die with wiring. The second layer is bonded to the first layer such that the wiring of the second layer interconnects with the active circuitry of the first layer and extends an amount of wiring possible in the first layer.

32 Claims, 12 Drawing Sheets

(56) References Cited

U.S. PATENT DOCUMENTS

| | | |
|---|---|---|
| 2007/0023887 A1 | 2/2007 | Matsui et al. |
| 2015/0371938 A1 | 12/2015 | Katkar et al. |
| 2017/0062366 A1* | 3/2017 | Enquist ............... H01L 25/0657 |
| 2017/0162507 A1* | 6/2017 | Das ....................... H01L 23/481 |
| 2017/0330805 A1* | 11/2017 | Warner ............... H01L 21/8221 |
| 2017/0338150 A1 | 11/2017 | Tseng et al. |
| 2018/0026019 A1* | 1/2018 | Tao .................... H01L 23/3157 |
| | | 257/668 |
| 2018/0374821 A1* | 12/2018 | Chen ....................... H01L 24/17 |
| 2020/0006232 A1 | 1/2020 | Pietambaram et al. |
| 2020/0027728 A1 | 1/2020 | Wang et al. |
| 2023/0034691 A1 | 2/2023 | Ito et al. |
| 2023/0055685 A1 | 2/2023 | Miyazawa et al. |

OTHER PUBLICATIONS

Sanchez, L. "Chip to Wafer Direct Bonding Technologies for High Density 3D Integration" IEEE 62nd Elec. Comp. and Tech. Conf. 2012 Jun. 30, 2012 pp. 1960-1964 (Year: 2012).*

Fontaine, Ray, "A Survey of Enabling Technologies in Successful Consumer Digital Imaging Products," TechInsights (Apr. 14, 2017).

Zhang, Jun, "The Evolution of CMOS Image Sensors," Linkedin, https://www.linkedin.com/pulse/evolution-cmos-image-sensors-jun-jonathan-zhang/ (Jun. 14, 2017).

* cited by examiner

DEVICE DISAGGREGATION FOR IMPROVED PERFORMANCE

CROSS-REFERENCE TO RELATED APPLICATIONS

The present application is a continuation of U.S. patent application Ser. No. 16/156,506, filed Oct. 10, 2018, now issued as U.S. Pat. No. 10,700,094, which claims the benefit of the filing date of U.S. Provisional Patent Application No. 62/715,966 filed Aug. 8, 2018, the disclosure of which is hereby incorporated herein by reference.

BACKGROUND

There are several devices that are limited by the interconnect density that exists within the same monolithic device. Examples of such devices include switch matrix devices, Field programmable gate arrays (FPGAs), traffic managers, etc. Such devices would benefit from a 3-dimensional (3D) implementation. For example, FPGAs typically include a configurable memory, such as an array of logic blocks, input/output (I/O) pads, and routing channels. The configurable memory is typically large in physical size, and seldom used. A logic block may include one or more logic cells including lookup tables (LUTs) combined with multiplexers and other elements. These can be configured in various multiplexing ratios. FPGAs may also include multiplexers used to reroute wires. Multiplexer capability must be balanced with available wiring to avoid implementations that are unroutable. The cost and yield impact of adding layers to an FPGA is a current limitation on performance of the FPGA. As such, the FPGAs are held back by a lack of availability of additional connection paths.

FPGAs further typically include an embedded memory, which requires a high bandwidth. For example, all buffering for all processing that may be occurring in FPGA may be done using the embedded memory. The embedded memory can be internal to a chip, or can sometimes be off-chip at the expense of increased latency and power consumption.

High bandwidth memory (HBM) is a 3D memory with multiple layers of die bonded together and vias extending through silicon, allowing for highest possible bandwidth with density of memory adequate to address the bandwidth. The die at a bottom of the multiple layers handles all external communication, and handles all address and control communications with the layers above it.

Stacked architectures have evolved from single-chip chip scale packages (CSP) to 2-dimensional (2D) package on package (PoP) and stacked CSP to thinner profile fanout wafer level CSP. However, the ability to stack further has been limited by size and power constraints, as well as cost. Further limits on stacked architectures include bandwidth and latency between devices in these formats. For example, semiconductor devices may be fabricated in different nodes, representing different distances between identical features in the device. For example, earlier devices included legacy nodes of 32 nm, 28 nm etc., and later devices include advanced nodes having much smaller critical dimensions. As the node decreases, the number of layers available increases. However, it is only possible to have a limited number of layers, and the layers in advanced nodes are expensive due to the depreciation of the newer equipment in these newer wafer foundries.

BRIEF SUMMARY

The present disclosure provides chip architectures for FPGAs and other routing implementations that provide for increased memory with high bandwidth, in a reduced size, accessible with reduced latency. The memory in such examples may be custom made for each device. The disclosure further provides examples of true 3D architectures, including chip stacking with dense interconnects between layers of the stack.

One aspect of the disclosure provides a 3D semiconductor device, including a first layer in advanced node, a second layer in legacy node, and a plurality of interconnects. The first layer may include an active die, active circuitry, and a configurable memory. The second layer may include a passive die with wiring, wherein the second layer is bonded to the first layer such that the wiring of the second layer interconnects with the active circuitry of the first layer to connect one or more first points on the active die to one or more second points on the active die. The plurality of interconnects may be a plurality of external interconnects extending through the passive die and adapted to couple the wiring with an external device.

According to some examples, the active circuitry of the first layer includes a plurality of multiplexers. Some of the multiplexers may have ratios of at least 32:1 or greater. Some of the active circuitry may be hardcoded. The interconnects between the first layer and the second layer may have a pitch of 10μ or less. An interconnect density between the first layer and the second layer may be approximately $10^5$-$10^6$ connections/mm². The active die may further include an embedded memory residing over the multiplexers and look-up tables of the active circuitry.

In some examples, the 3D semiconductor device may be a field programmable gate array. In other examples, the 3D semiconductor device may be a switch matrix or a traffic manager.

The plurality of external interconnects may include data interconnects, power interconnects, and ground interconnects in a repeating pattern. For example, the repeating pattern may include one or more stripes of the data interconnects between one or more stripes of power interconnects and one or more stripes of ground interconnects.

Another aspect of the disclosure provides a 3D semiconductor device, including a first tier and a second tier bonded to the first tier. Each of the first tier and the second tier may include a first layer in advanced node, the first layer including an active die, active circuitry, and a configurable memory. Each tier may further include a second layer, the second layer including a passive die with wiring, wherein the second layer is bonded to the first layer such that the wiring of the second layer interconnects with the active circuitry of the first layer to connect one or more first points on the active die to one or more second points on the active die.

According to some examples, the second layer may be in legacy node. The second layer may be bonded to the first layer such that the wiring of the second layer interconnects with the active circuitry of the first layer to connect one or more third points on the active die to an external device. The first tier and the second tier may be face-to-face bonded. In some examples, the 3D semiconductor device further includes a third tier, the third tier also comprising an advanced node layer and a passive layer. The third tier may be front-to-back bonded to the second tier, or back-to-back bonded to the second tier, such as with through-silicon vias extending between the second tier and the third tier.

The active circuitry of the first tier may include at least one look-up table, the at least one look-up table configured to access the configurable memory of the first tier and the configurable memory of the second tier. The at least one look-up table may be configured to access the configurable memory of the first tier and the configurable memory of the second tier in a given clock cycle.

In some examples, the 3D semiconductor device may further include an interface including a plurality of data interconnects, power interconnects, and ground interconnects in a repeating pattern.

Yet another aspect of the disclosure provides a field programmable gate array, including a first layer in advanced node, the first layer including an active die and active circuitry, the active circuitry comprising a plurality of multiplexers and a plurality of hardcoded logical connections, and a second layer in legacy node, the second layer including a passive die with wiring, wherein the second layer is bonded to the first layer such that the wiring of the second layer interconnects with the active circuitry of the first layer to connect one or more first points on the active die to one or more second points on the active die. The field programmable gate array may further include an embedded memory residing over the plurality of multiplexers and a plurality of look-up tables.

DETAILED DESCRIPTION

While the following disclosure provides a number of examples, it should be understood that the concepts and techniques are not limited to specific examples, but rather can be more broadly applied. For example, while the examples herein may refer to FPGAs, it should be understood that the technology described in such examples could also be applied to other devices, such as routers, switch matrix devices, traffic managers, etc.

Figure 1:
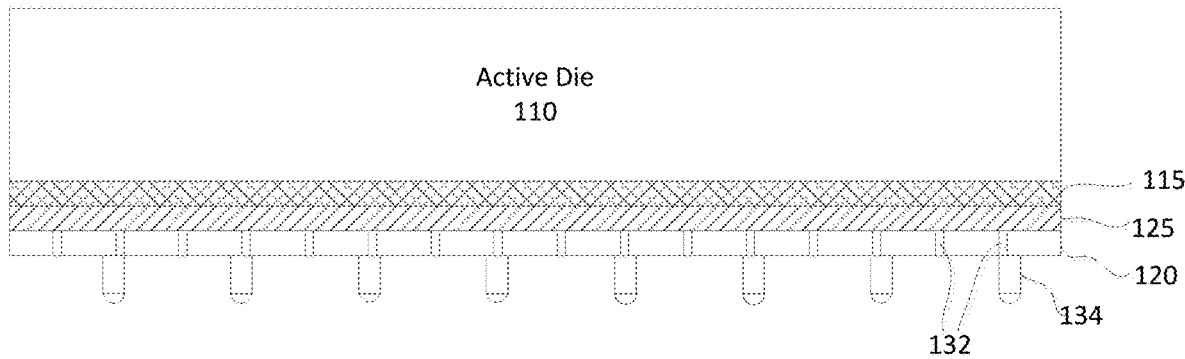
FIG. 1 is a block diagram of an example 3D chip architecture according to aspects of the disclosure.

FIG. 1 illustrates an example 3D chip architecture, including an active die 110 including active circuitry 115 coupled to passive circuitry 125 of a passive wiring die 120. The active die 110 is in an advanced node. The advanced node may relate to a relatively recent manufacturing process that provides for greater interconnect density as compared to older nodes. By way of example only, the advanced node may be 10 nm, 7 nm, 5 nm, 3 nm, or below, while the passive die 120 is in a legacy node, such as 28 nm, 40 nm, etc.

The passive wiring die 120 may be formed of any semiconductor material, such as silicon, glass, InP, SiGe, SOI, GaAs, GaN, SiC, LiTaO$_3$, LiNbO$_3$, sapphire, etc. In some examples, it may be extremely thin, such as having a thickness below 50 μm. For example, the passive die may be approximately 5 μm in some examples. However, it should be understood that any thickness may be used.

The passive wiring die 120 includes wiring in one or more routing layers. The routing layers may be formed using any of a variety of conventional fabrication techniques used for legacy nodes. Multiple routing layers may be separated by, for example, passivation layers, such as silicon dioxide, silicon nitride, polymer or other materials. The passive die 120 can make data signal connections back to the active die 110. In contrast to a conventional interposer which can only take signals to and from an active die, adding layers to the active die 110 improves the connectivity within the active die 110. While a single passive wiring die 120 is shown in FIG. 1, it should be understood that multiple passive wiring dies may be added to a stack to an extend an amount of wiring of the active die 110.

As shown in FIG. 1, the passive die 120 further includes a plurality of interconnects 132. The interconnects may establish an electronic connection between the circuitry 115 and one or more external devices. In some instances, a bump 134 or pillar may interconnect to a further layer. For example, the bump 134 may be used to integrate with another unit, such as a PCB, package, interposer, etc.

The active die 110 may be in silicon, GaAs, SiGe, SOI, or any substrate suitable for active circuitry. The active die 110 may include, for example, an FPGA or components thereof, or other logic devices, such as network switching circuitry. As such, the active die 110 may include a plurality of multiplexers and look-up tables (LUTs).

Figure 2:
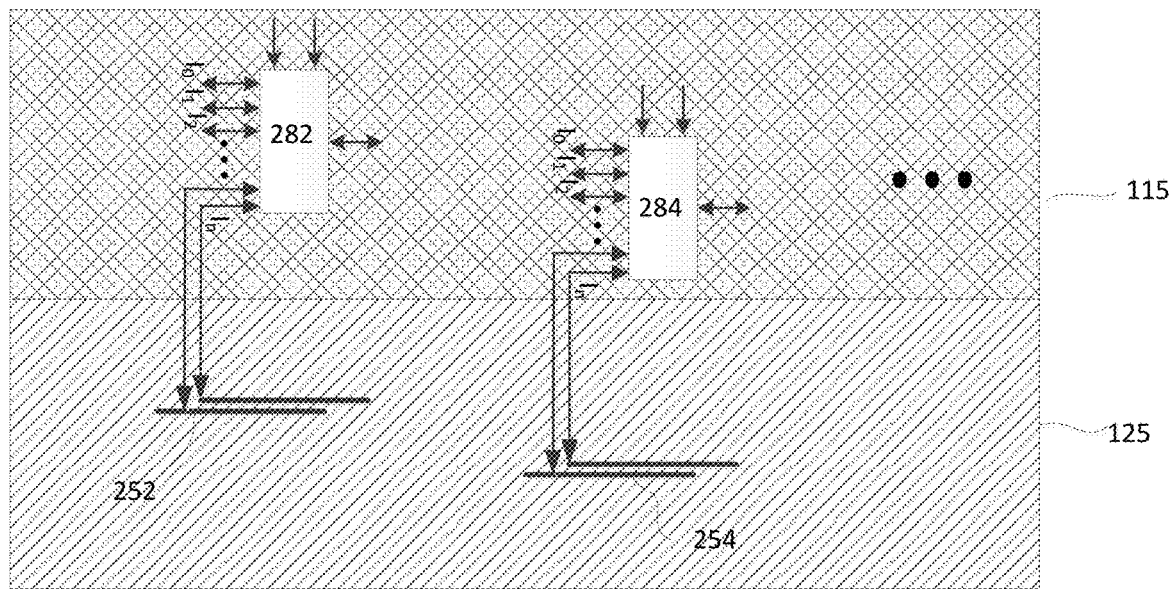
FIG. 2 is a detailed view of functional components of the 3D chip architecture of FIG. 1, according to aspects of the disclosure.

The joining of the passive die 120 to the active die 110 extends a possible amount of wiring of the active die 110. For example, the passive die 120 provides for connections between points on the active die 110 to other points on the same active die 110. The extra wiring creates an ability for the active die 110 to use deep multiplexers, such as 32:1 or greater. For example, FIG. 2 illustrates a detailed view of the passive circuitry 125 of the passive die 120 and the active circuitry 115 of the active die 110. Passive circuitry 125 includes wiring 252, 254. The wiring 252, 254 may form one or more routing layers of the passive die. The active circuitry 115 in this example includes a plurality of multiplexers 282, 284, which leverage the wiring 252, 254 of the passive circuitry 125.

The multiplexers 282, 284 may have various ratios, including large ratios such as 32:2, 64:2, or greater. Moreover, the ratio for a first multiplexer 282 may differ from that of a second multiplexer 284. While only two multiplexers are shown, it should be understood that the active circuitry 115 may include any number of multiplexers.

The additional wiring of the passive die 120 provides an ability to program more code into smaller devices. Because the passive die 120 is less expensive than the active die 110, the design combining the active die with the passive die provides the benefit of the additional available wiring that is also economically advantageous as compared to adding extra layers in advanced node. Moreover, the design may be fabricated using legacy foundry equipment, thereby reducing a need for purchasing new equipment. For example, existing equipment from legacy nodes can be used given that the wiring layers do not need to have the finest geometry. This enables a cost reduction in adding of the extra wiring layers.

In some examples, costs may be further reduced by prewiring some connections of the active node circuitry, rather than using multiplexers. For example, rather than making every route path possible with numerous multiplexers, an implementation of the chip may only require some routes to have various possible paths while other routes are the same every time. The routes that are the same every time may be fixed in place by hardcoding or prewiring the connections, rather than using a multiplexer. For example, a generic FPGA may be used and one or more of the routing paths may be hardcoded, such that the paths are fixed in a program in such a way that they cannot be altered without altering the program. For example, inputs, outputs, or the paths between them could not be changed without altering the source code. The reduction in multiplexers will result in reduced power consumption of the device.

Figure 3A:
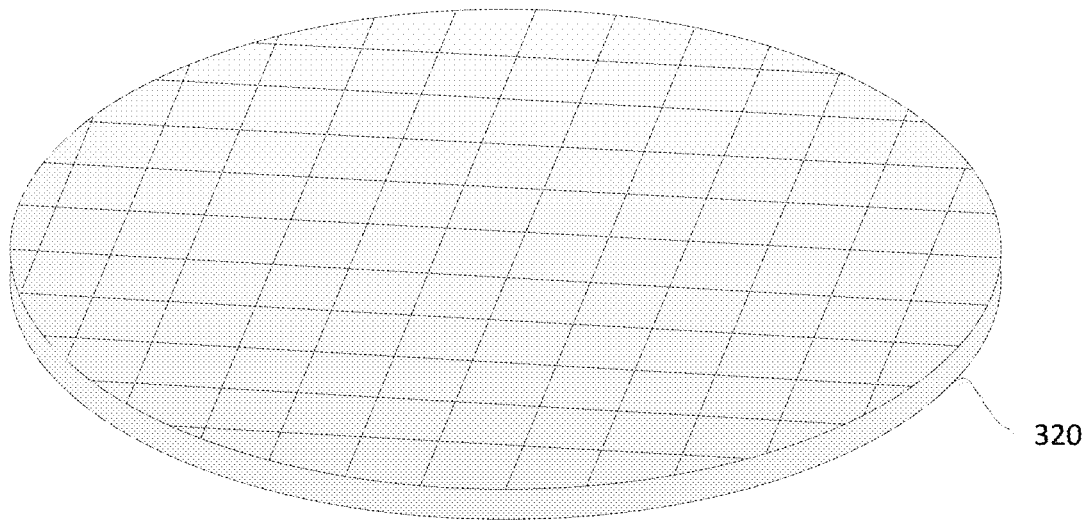
FIGS. 3A-3C illustrate an example process of forming the example 3D chip architecture of FIG. 1, according to aspects of the disclosure.
Figure 3B:
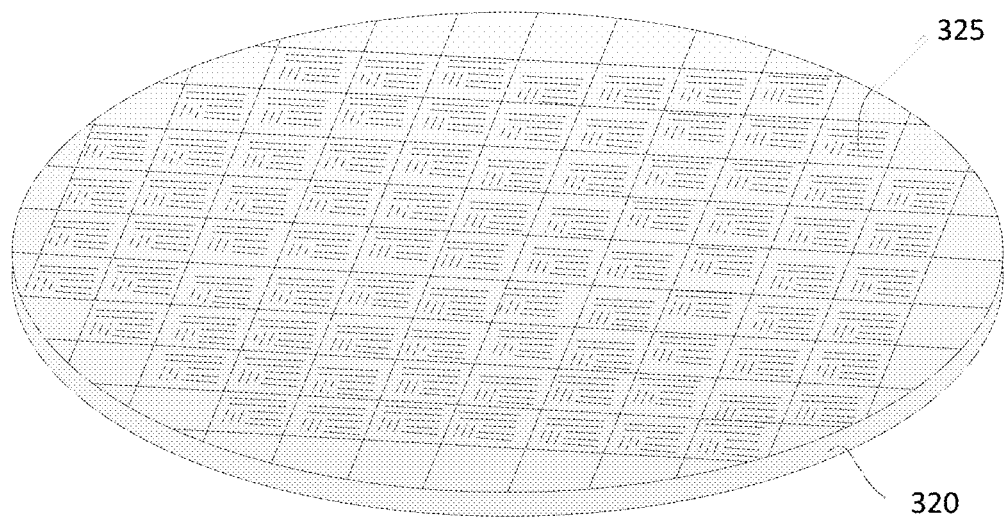
Figure 3C:
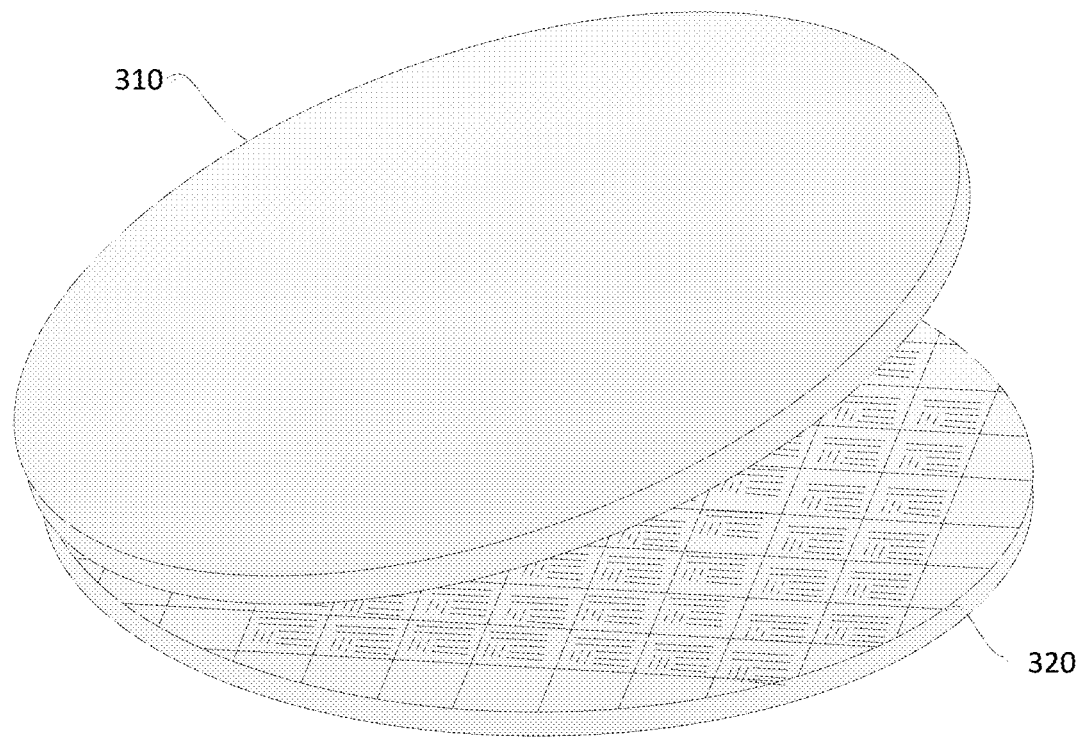

FIGS. 3A-3C illustrate an example method of joining the active die 110 to the passive die 120. In FIG. 3A, a wafer 320 is provided. The wafer 320 may be made of any foundry process compatible material, such as glass, semiconductor material, etc. Though not shown, the wafer 320 may have started at a first thickness that was thinned by any available process, including mechanical processes such as plasma etching, chemical-mechanical polish (CMP), grinding, lapping, ablation, or the like, chemical processes, etc.

As shown in FIG. 3B, routing layers 325 may be formed on the wafer 320. For example, the routing layers 325 may be formed by depositing wiring materials, etching, etc. While illustrated as a separate phase of the process, it should be understood that the formation of the routing layers may be integrated with formation of the wafer 320. Though not shown, the routing layers 325 may each terminate in one or more contacts, such as bond pads, etc., that may be coupled to contacts of an active layer.

In FIG. 3C, an advanced node wafer 310 is bonded to the legacy node passive wafer 320. Active circuitry on the advanced node wafer 310 is bonded to the routing layers 320. The bonding may be performed using any of a variety of processes. For example, the dies or wafers may be bonded in a stacked arrangement using various bonding techniques, including using direct dielectric bonding, non-adhesive techniques, such as a ZiBond® direct bonding technique or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). According to some examples, the bonding is performed using a process that includes a spontaneous chemical reaction causing metal surfaces to bond while byproduct diffuses away from a bond interface. This process enables the active wafer 310 to bond to the passive wafer 320 with connections at extremely fine pitch. For example, the connection may be at a pitch as low as approximately 1μ-10μ. The fine pitch interconnecting provides for lower power consumption, higher performance, and reduced area all at the same time. Interconnects between the two wafers weld at a low temperature with a high density connection, producing a symbiotic relationship between the wafers. For example, the fine pitch produced by DBI® or ZiBond® may provide for interconnect density of approximately $10^5$-$10^6$ connections/mm$^2$, which is approximately 1000 times greater than using through-silicon vias. As such, the design may be used in any of a number of implementations, such as system-on-chip (SoC) layout. Moreover, multiple layers may be bonded together, in some instances with thinning of the layers between bonding, allowing for high interconnect density with a short thickness of remaining silicon or other foundry-compatible material. A resulting multi-level design achieved through the process may thus have a rigid permanent attachment of many layers that looks like one piece of silicon or other foundry compatible material.

Figure 4A:
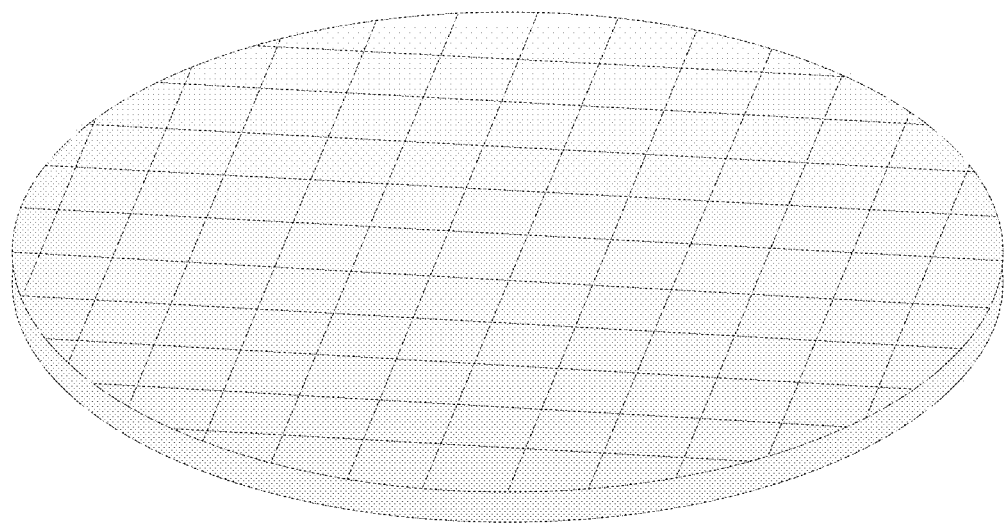
FIGS. 4A-4C illustrates another example process of forming the example 3D chip architecture of FIG. 1, according to aspects of the disclosure.
Figure 4B:
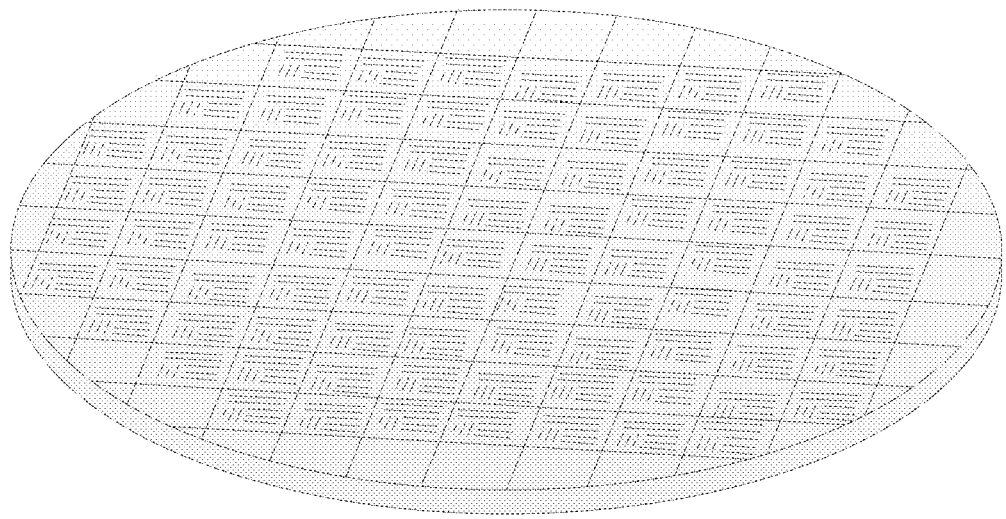
Figure 4C:
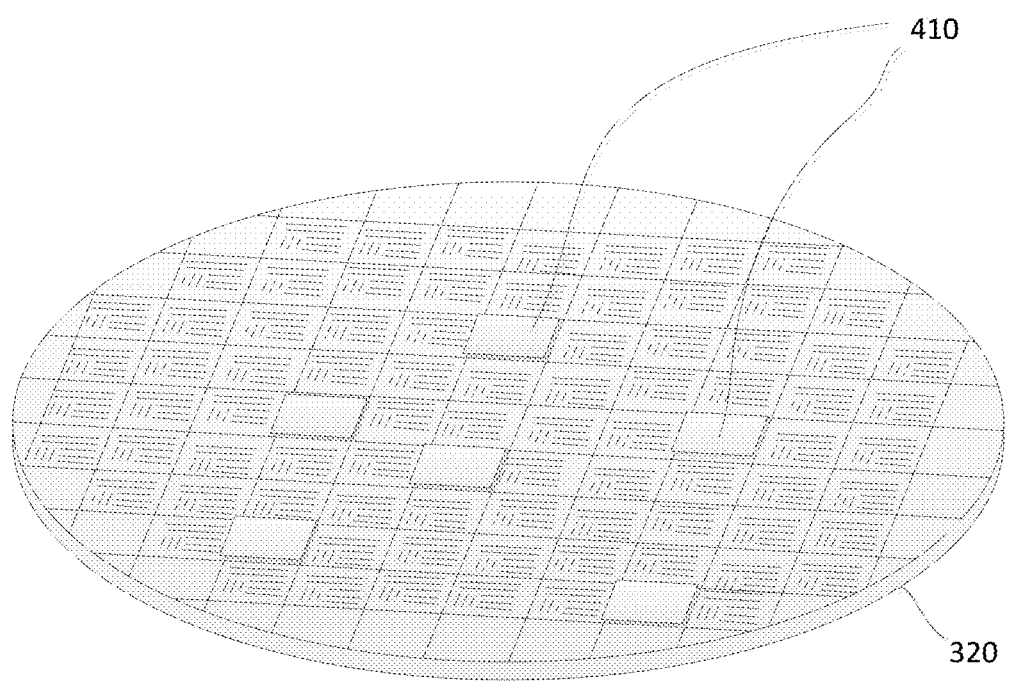

FIGS. 4A-4C provide for another example process of bonding the active circuitry to the passive circuitry. In FIGS. 4A-B, the passive die and wiring is provided, as described above in connection with FIGS. 3A-B. In FIG. 4C, a die-to-wafer bond is performed. For example, active node dies 410 may be bonded to the wafer 320, such as through the DBI process. The interconnect pitches in the die-to-wafer process are comparable to the wafer-to-wafer processes and infer a similar performance benefit. This allows for different die sizes to be used. There is also the potential of adding more than one die per layer (side-by-side) in order to extract benefits.

Figure 5A:
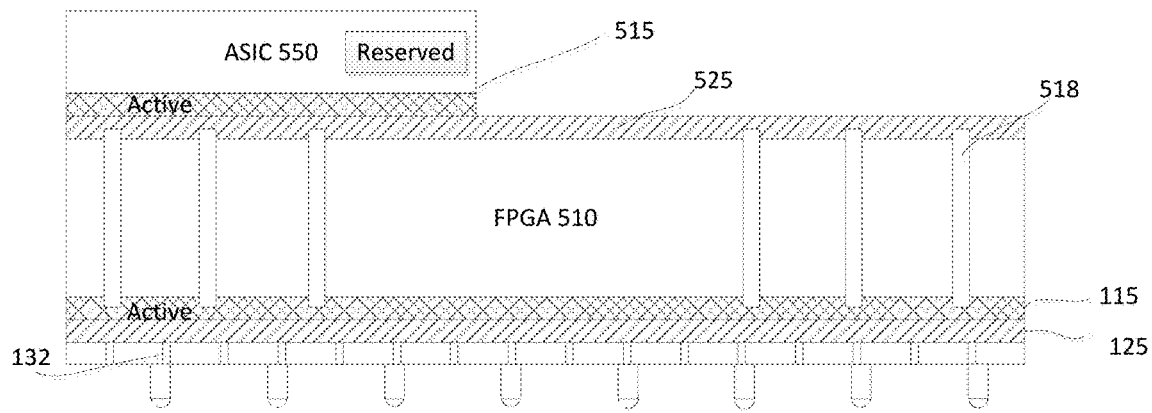
FIG. 5A-5B illustrate example implementations of the example 3D chip architecture of FIG. 1, according to aspects of the disclosure.
Figure 5B:
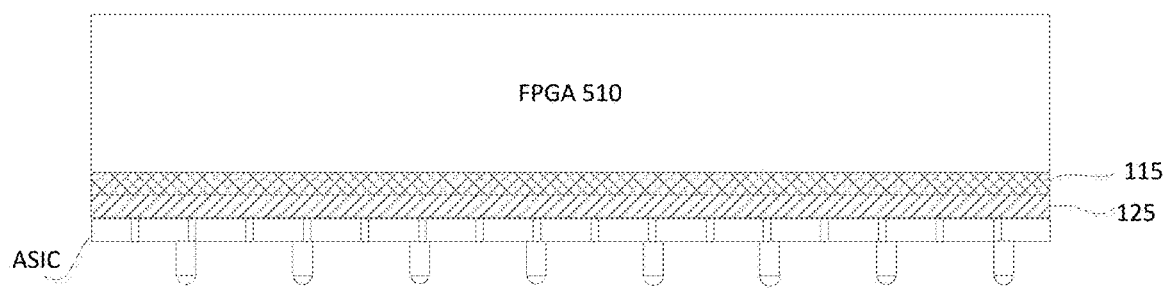

FIGS. 5A-5B illustrate example implementations including an application specific integrated circuit (ASIC) 550 for a particular application. To make the application less specific, an FPGA 510 may be wired to different parts of the ASIC 550. For example, the wiring may be performed through the passive circuitry 125. As shown in FIG. 5A, a smaller ASIC is stacked on top of the FPGA 510. In FIG. 5B, the FPGA 510 is stacked on top of a larger ASIC 555, such as through ZiBond® or DBI®. In some examples, parts of the ASIC 550 may be reserved for field programmable. As such, code can be changed at a later time to update the ASIC, rather than swapping the ASIC out. This may prolong a lifespan of the ASIC, or prevent it from becoming obsolete.

According to some other examples, a passive routing layer of the chip may be used to effectively configure input/output (I/O). For example, I/O connections to buffers within the chip may be changed through the passive or active circuitry. Some layers of the chip may be maintained, while layers interfacing with other devices are swapped out. For example, the passive die 120 may be swapped out with another passive die having different routing paths. The interchangeable passive layers allow for hard flexibility in routing which may be more power-efficient than having the soft programmability of multiplexers. This may purposely restrict some level of programmability based upon application, market, desire to reduce the power dissipation of a devices or other reasons.

Figure 6A:
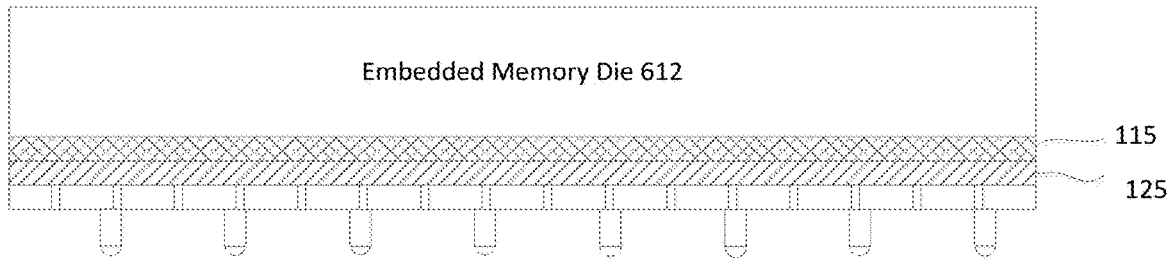
FIGS. 6A-6C illustrate further example 3D chip architectures according to aspects of the disclosure.

FIG. 6A illustrates another example 3D chip architecture, wherein an embedded memory die 612 is interconnected to the active circuitry 115 of an FPGA. For example, the embedded memory die 612 may be face-to-face bonded to the multiplexers and LUTs, thereby creating an embedded memory layer over a layer of multiplexers and LUTs. By integrating the embedded memory 612 in the stack, latency and power consumption are reduced as compared to a design where the memory is written and read off-chip. Such design also provides for increased bandwidth, and thus faster operation and access to more memory.

A further benefit of the design of FIG. 6A is die size reduction, moving away from reticle limits. For example, most reticles are limited to about 32×26 mm Using a 3D approach enables providing more circuits in that reticle limit, because more die can be included in a 3D stack. Given that latency between the die can be lower than latency within the die, more available effective area can be achieved without reticle limits.

The embedded memory 612 may be configured to emulate a many-ported memory, thus making it highly parallel. For example, by emulating a many-ported memory, the embedded memory 612 may be adapted to handle regular expression search, networking, data lookup, encryption, compression/decompression, and any of a variety of other functions.

Figure 6B:
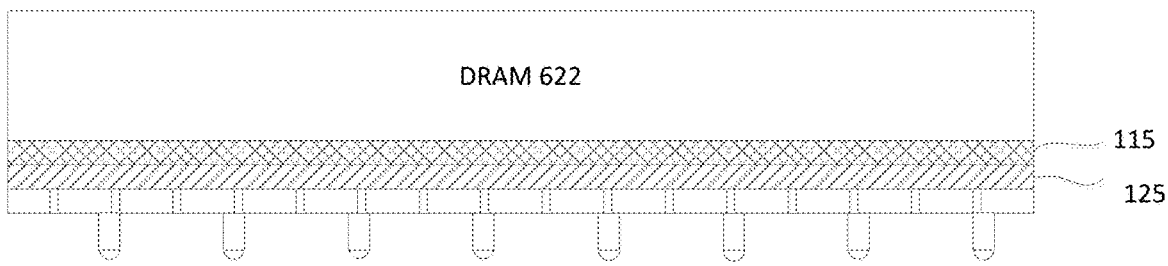

While FIG. 6A illustrates the interconnection of an embedded memory die, it should be understood that other types of memory may be interconnected. For example, as illustrated in FIG. 6B, direct random access memory (DRAM) 622 may be interconnected to the active circuitry 115.

Figure 6C:
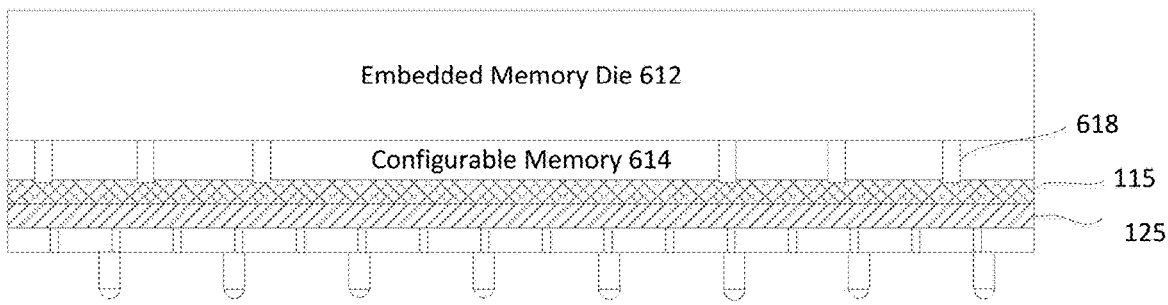

According to some examples, the design of FIG. 6A may be extended to additional die. For example, as shown in FIG. 6C, configurable memory 614 may be added over the multiplexers and LUTs of the active circuitry 115, with the embedded memory 612 added over the configurable memory 614. In this example, one or more vias 618 may extend through the configurable memory 614, coupling the active circuitry 115 to the embedded memory 612.

Figure 7:
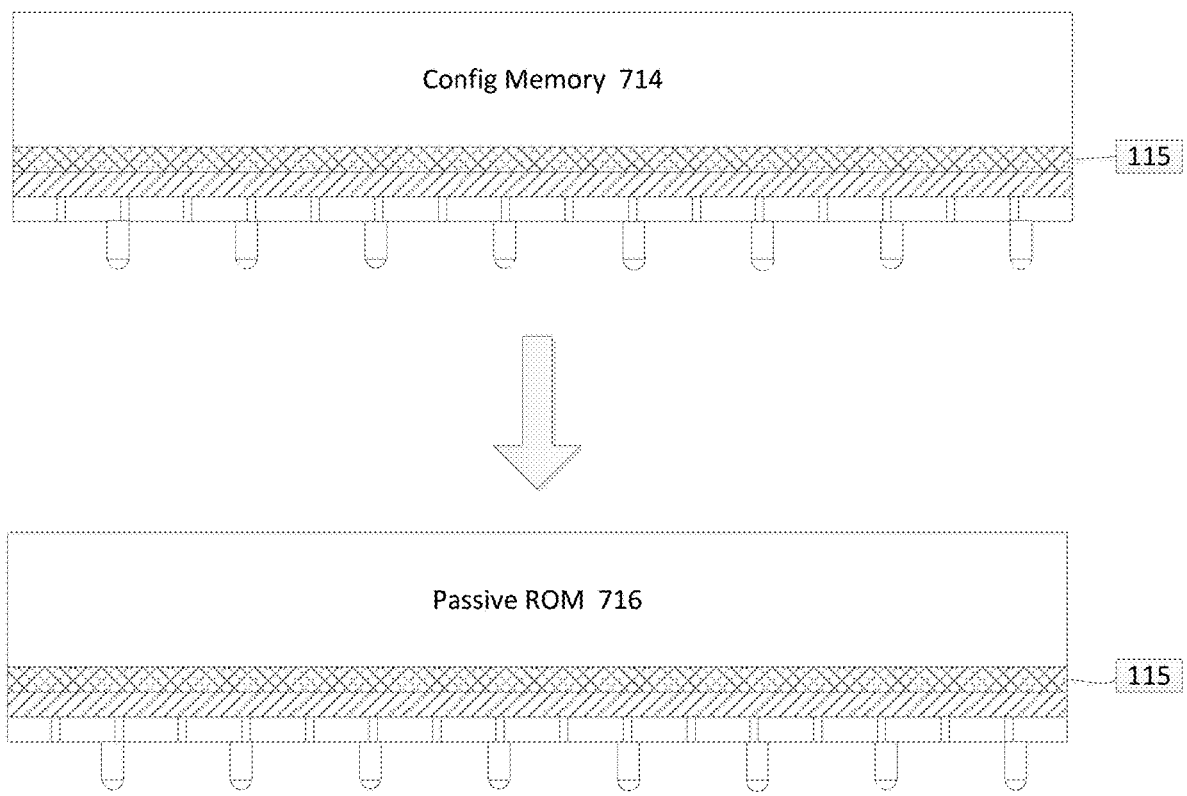
FIG. 7 illustrates an example process of optimizing a 3D chip architecture according to aspects of the disclosure.

FIG. 7 illustrates an example optimization of effectively converting a configurable memory portion 714 to a passive read only memory (ROM) equivalent 716. For example, the configurable memory portion 714 may be a configuration of switches that may be set high or low, or 1 or 0. Once programming for the FPGA is optimized, and no further changes are desired, the configurable memory 714 is no longer needed, because no further configuring of the memory needs to occur. Accordingly, the configurable memory may be converted to a passive ROM. For example, instead of memory switching between 1s and 0s, connections may be hardcoded such that the configurable memory 714 does not have transistors. Each pin may be connected to power or ground, effectively converting the configurable memory 714 to the passive ROM 716, and resulting in an FPGA with permanent, unchangeable code.

Replacing the configurable memory 714 with a passive ROM 716 provides cost benefits in that eliminating a need for active circuits such as transistors, and instead using a passive wafer, significantly reduces the cost of materials. Moreover, the ROM 716 operates using a reduced amount of power as compared to the configurable memory 714, thereby providing a power saving benefit. Eliminating transistors further eliminates their leakage contribution, and thus an overall amount of leakage drops when using the passive ROM 716 instead of the configurable memory 714. Further, there is no change to the multiplexers and LUTs in the active circuitry 115. As such, replacing the configurable memory 714 with a passive ROM 716 will not result in a timing change.

Figure 8:
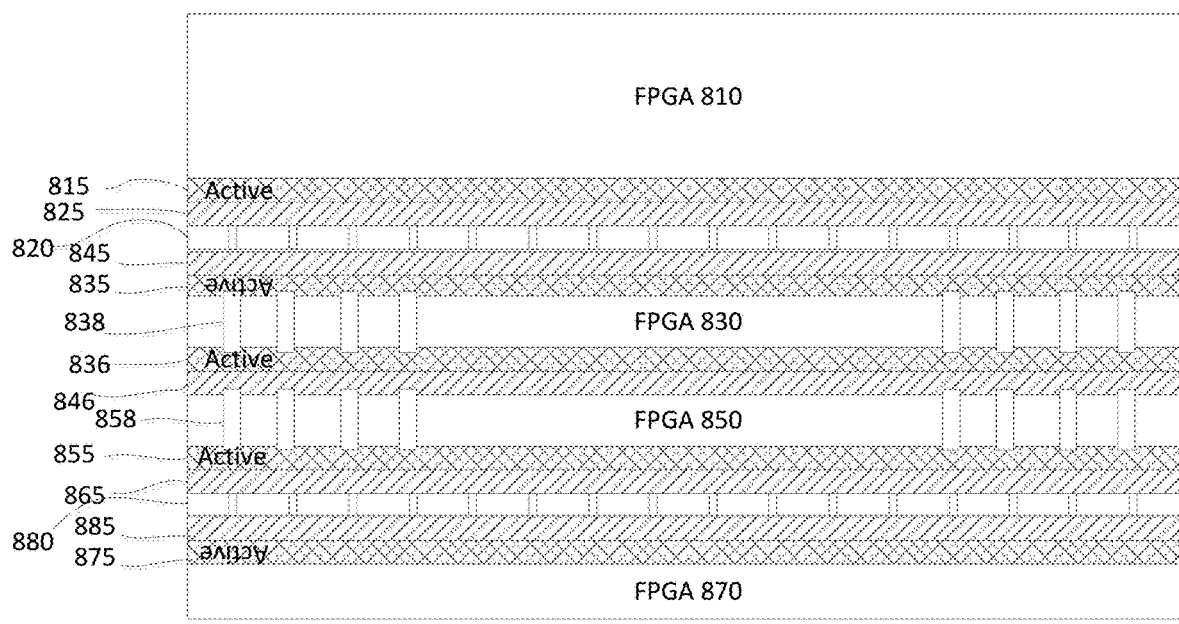
FIG. 8 is a block diagram of another example 3D chip architecture according to aspects of the disclosure.

FIG. 8 illustrates multiple tiers of FPGA. For example, the chips of any of the examples described above may be stacked on top of one another, such as in a heterogeneous stack with FPGA blocks. The chips may be face-to-face bonded, back-to-back bonded, face-to-back bonded, or any combination thereof. For example, as shown in FIG. 8, FPGA blocks 810, 830, 850, 870 are stacked. In this example, block 810 is face to face bonded to block 830, and block 850 is face to face bonded to block 870. Legacy die 820 including interconnects has passive circuitry 825, 845 on either side. Similarly, legacy die 880 has passive circuitry 860, 880 on either side. High density routing may be provided across the face to face connections. According to some examples, different FPGA blocks 810, 830, 850, 870 may include different components. For example, one block may include a configurable memory while another includes an embedded memory, etc. A highest density of signals may be between the multiplexers and embedded memory. High bandwidth connections may be provided between the multiplexers and LUTs. The configurable memory may have fewest connections to both the multiplexers and LUTs.

FPGA block 830 is back to back bonded to FPGA block 850. Through-silicon vias (TSVs) 838, 858 may be used to establish connections across the FPGA blocks 830, 850. For example, the TSVs 838, 858 may provide connections between the configurable memory and the multiplexers. Low density routing may be provided across the back to back connections.

According to some examples, multiplexable links may be shared between the dies. A link can be multiplexed within the same die or between dies. If the stack is mounted on an ASIC, a number of interconnect pads may provide more potential signal locations than needed. Accordingly, such additional potential signal locations can be routed if it becomes necessary.

Memories in this example architecture could be SRAM-based or non-SRAM-based. For example, the memories may in some instances include DRAM or non-volatile memories.

The stack provides an increased number of interconnects, without consuming additional area along a horizontal axis. By stacking vertically, only a few microns of additional area may be needed along a vertical axis.

Figure 9:
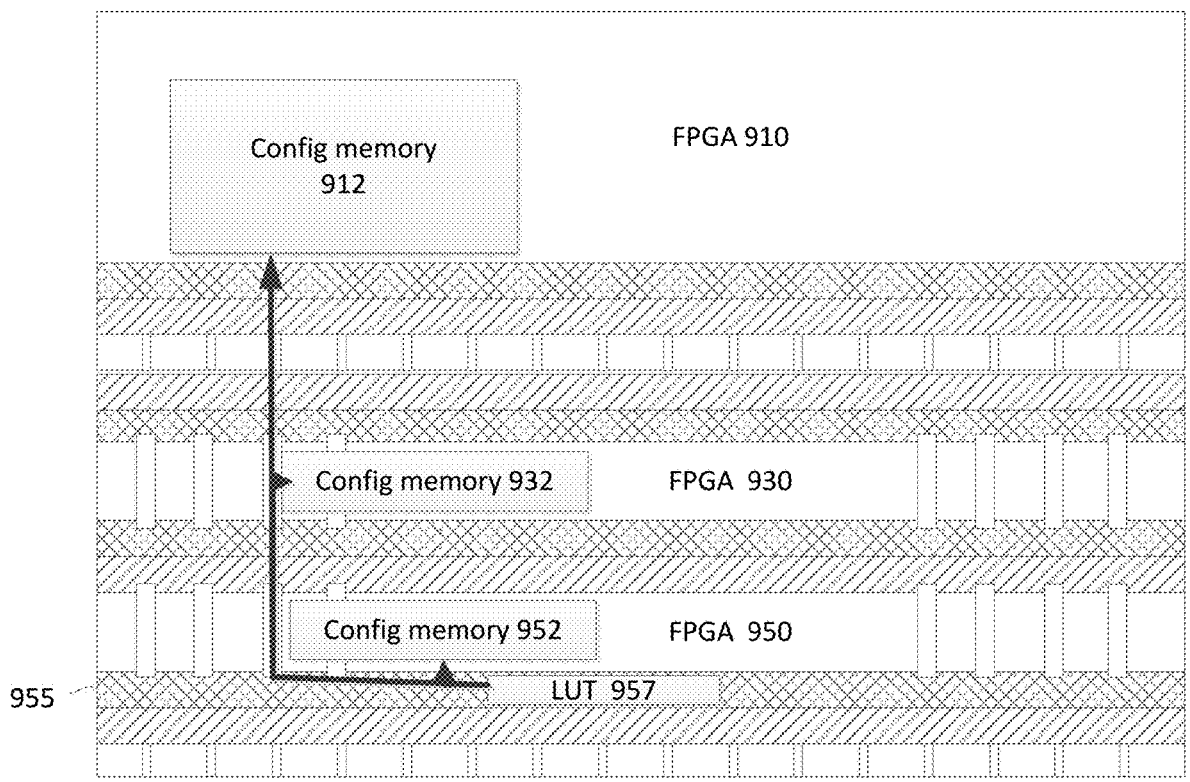
FIG. 9 is a functional block diagram illustrating an example of memory access in the 3D chip architecture of FIG. 8, according to aspects of the disclosure.

FIG. 9 illustrates an example of memory access in a stacked architecture, such as discussed above in connection with FIG. 8. According to this example, an FPGA can reference different memory content in each clock cycle. For example, each FPGA block 910, 930, 950 may include a configurable memory 912, 932, 953, respectively. A given LUT, such as LUT 957 in active circuitry 955, is configured to reference one or more of the memories 912, 932, 952 above it. For example, the LUT 957 can access each of the memories 912, 932, 952 in a given clock cycle.

Because the LUT 957 can reference multiple memories in a clock cycle, the LUT 957 can behave as multiple LUTs. For example, for each different memory the LUT 957 can access in a given clock cycle, the LUT 957 can perform a function. Accordingly, if the LUT 957 can access 3 different memories, the LUT 957 can perform 3 different functions, and thus serve as 3 different LUTs. While only one LUT 957 is shown in FIG. 9, it should be understood that a number of LUTs may be included, each of which may be capable of accessing multiple memories in a given clock cycle. Because in some examples each LUT can serve as multiple LUTs, a greater amount of processing may be performed in the FPGA. For example, more bits are processed per clock cycle, because multiple memories are processed per clock cycle. In some examples, an overall number of LUTs in the FPGA may be reduced in view of the enhanced capabilities of each remaining LUT.

In some instances, the LUT 957 may cycle through some, but not all, of the configurable memories 912, 932, 952 in a given cycle. In such instances, partial reconfiguration is possible in nearly zero time.

According to some examples, a spare layer of memory may be used to capture a user state to act as a shadow processor. The shadow state can be read out asynchronously without disturbing a running processor. For example, in a given cycle, computation may be performed more quickly by predicting future requests and performing computations. The predictions may be based on, for example, a last bit of interest in a last process. While data is transferred in response to existing requests, predictions may made for future requests as an active shadow. Because the LUT is able to access multiple memories in one clock cycle, the LUT can access the spare layer of memory to retrieve the computations performed in response to the predicted requests, while also accessing memories for responding to current requests.

Figure 10A:
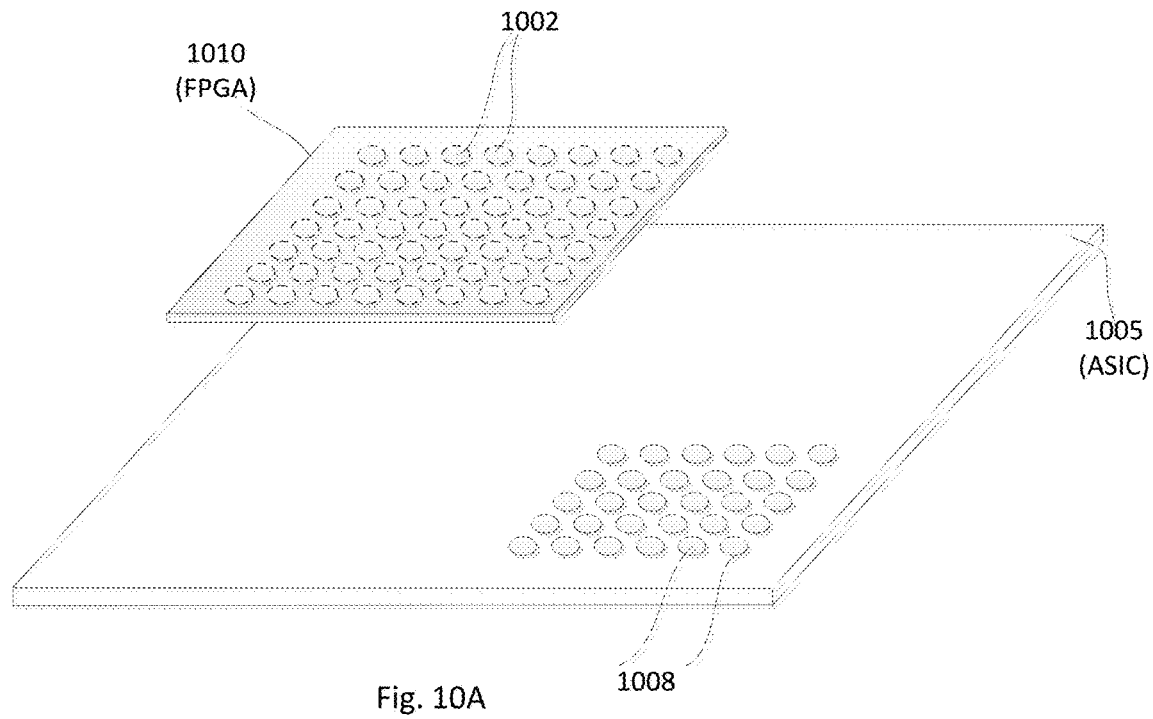
FIGS. 10A-10B illustrates example connection pads between devices according to aspects of the disclosure.
Figure 10B:
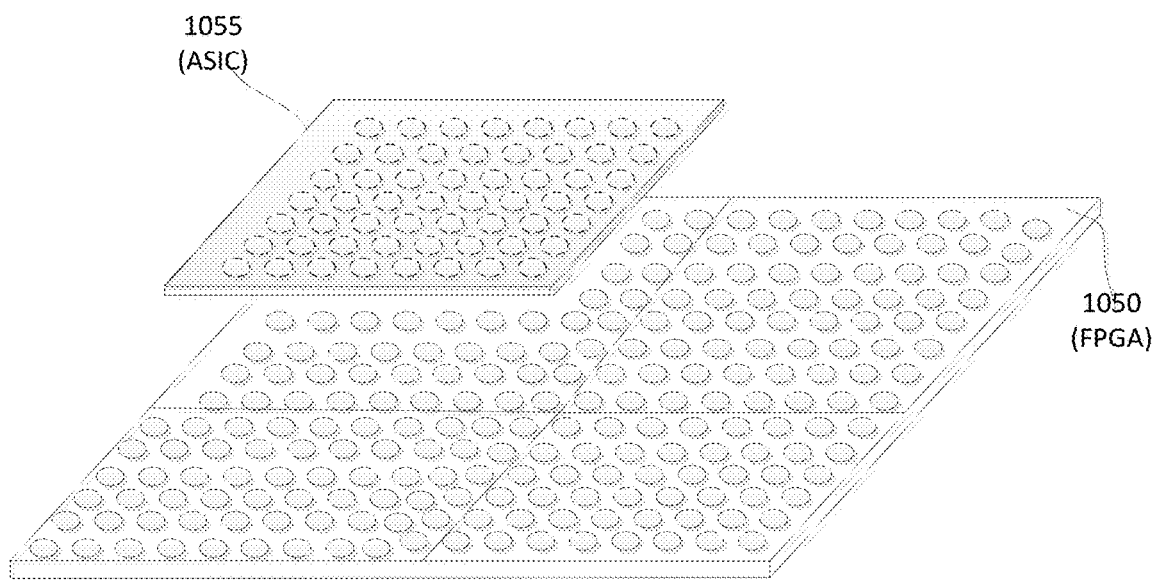

FIGS. 10A-10E illustrate example interfaces for a 3D chip architecture, such as an FPGA. A standard interface may be used, for example, to couple the FPGA to any given ASIC to improve performance of the ASIC. For example, as shown in FIG. 10A, a first smaller device 1000 may be mounted to a second larger device 1005. The first device 1000 may be an FPGA while the second device 1005 is an ASIC, or vice versa. In either case, the die of the larger second device 1005 may have a small area with pads 1008 for connection to a subset of pads 1002 on the smaller device. The FPGA can configure to activate only the connected pads to achieve a desired FPGA connectivity. While a few pads 1002, 1008 are shown on each device 1000, 1005, it should be understood that an actual number of pads may be much greater.

FIGS. 11A-D provide examples of different patterns for the interfaces of the FPGA. In each of these examples, a pattern of the contact pads is repeated. For example, a number of pads for data I/O, power, and ground are presented in some predefined sequence. While several predefined sequences or patterns are illustrated herein, it should be understood that any of numerous possible sequences or patterns maybe used. Multiplexers may be used to connect to pads from the ASIC. Using multiplexers for only those pads of the ASIC reduces a cost of the system. For example, if the ASIC is only going to use 1000 of 10 k available connections, multiplexers may connect only to the 1000 pads that will connect to the ASIC. Other I/O may be left floating or shorted to a supply.

Figure 11A:
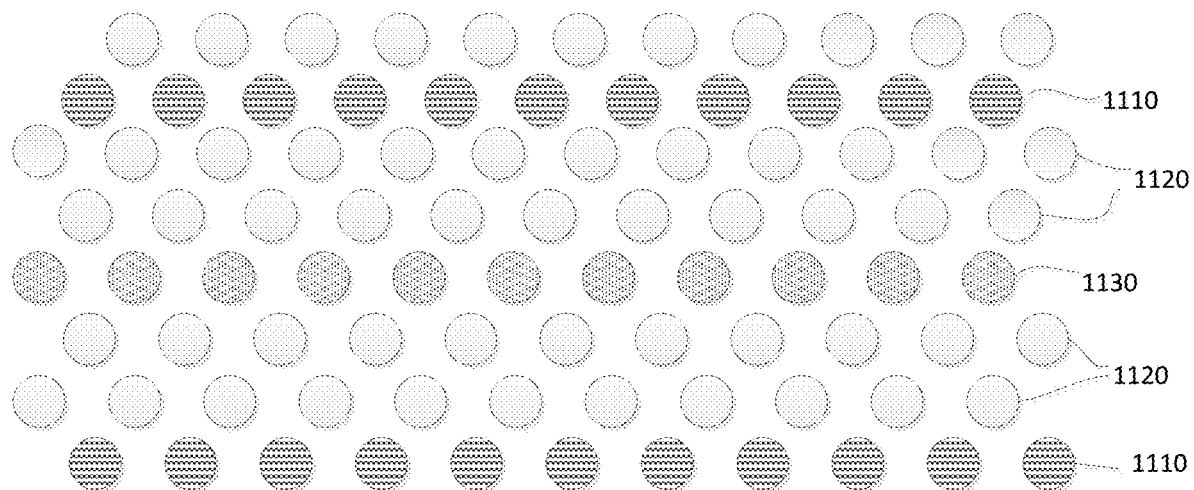
FIGS. 11A-11D illustrate example interfaces including an array of inputs and outputs for a 3D chip architecture according to aspects of the disclosure.

In FIG. 11A, rows of data I/O pads 1120 are provided in a pattern along with rows of power pads 1110 and ground pads 1130. The power and ground supplies are interspersed in a pattern to allows for adequate power delivery. While two rows of data I/O pads 1120 are shown between each pair of power and ground pads 1110, 1130, the number and sequence of rows of any type of pad may be varied. For example, more rows of data I/O pads 1120 may be provided, the sequence of power, data, and ground pads may be rearranged, etc.

Figure 11B:
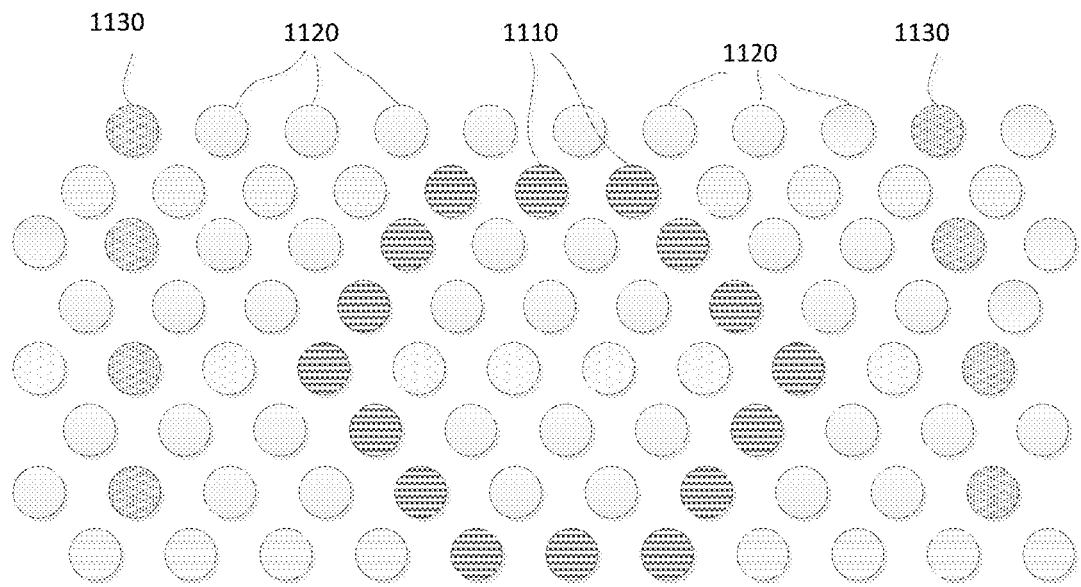

FIG. 11B provides an example of another pattern of pads on a face of the FPGA. In this example, the power pads 1110 form a hexagon, while the ground pads 1130 form lines on either side. The data pads 1120 fill in the remaining spaces. The power and ground supplies in this example are also interspersed in a pattern to allows for adequate power delivery.

Figure 11C:
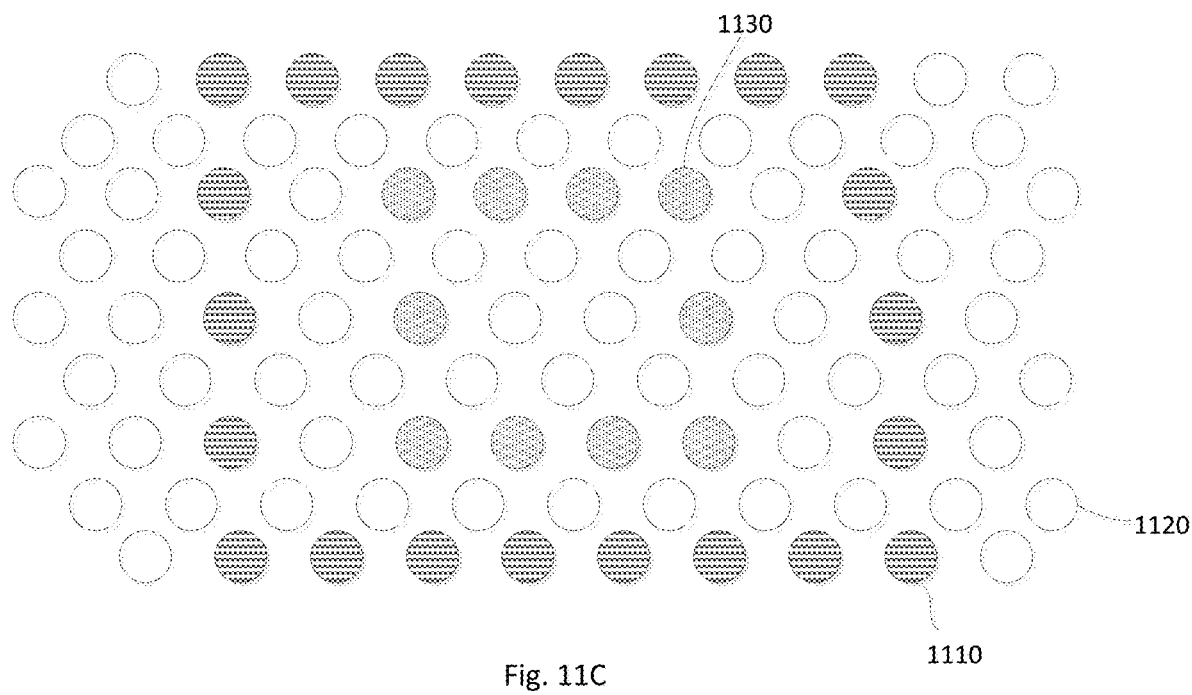

FIG. 11C provides an example of another pattern of pads of an interface, where power pads 1110 and ground pads 1130 form concentric rectangles, and data pads 1120 fill in remaining spaces. Rather than concentric rectangles, the pads could form a pattern of non-concentric rectangles, other concentric shapes, or other non-concentric shapes. The power and ground supplies in this example are also interspersed in a pattern to allows for adequate power delivery.

Figure 11D:
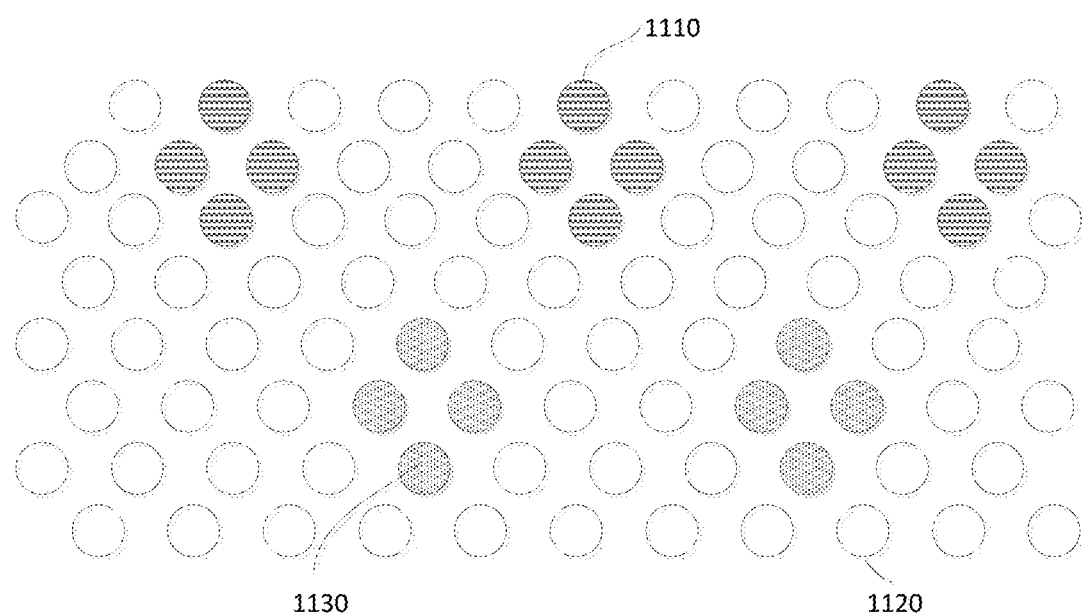

FIG. 11D provides another example, where power pads 1110 and ground pads 1130 form repeating diamond shapes. The power and ground supplies in this example are also interspersed in a pattern to allows for adequate power delivery. FIGS. 11A-11D are merely a few examples of the numerous interface patterns possible.

Although the invention herein has been described with reference to particular embodiments, it is to be understood that these embodiments are merely illustrative of the principles and applications of the present invention. For example, while some example architectures are described herein in connection with FPGAs, it should be understood that the present disclosure is not limited to FPGAs. Rather, the architectures may be implemented in any of a number of other types of devices, including, by way of example only, switches, such as network switches or datacenter switches, routers, etc. It is therefore to be understood that numerous modifications may be made to the illustrative embodiments and that other arrangements may be devised without departing from the spirit and scope of the present invention as defined by the appended claims.

The invention claimed is:

1. A method of manufacturing a programmable logic device from disaggregated device components, the method comprising:
   forming one or more routing layers on a wafer; and
   hybrid bonding one or more dies comprising logic components to the wafer to form, via the one or more routing layers, a plurality of routing paths communicatively coupling at least some of the logic components of the one or more dies to one another to form the programmable logic device.

2. The method of claim 1, wherein the wafer is bonded to the one or more dies via face-to-face hybrid bonding.

3. The method of claim 1, wherein the one or more dies and the one or more routing layers on the wafer are formed using different processing nodes.

4. The method of claim 1, wherein the one or more routing layers consist of passive circuitry.

5. The method of claim 1, wherein the wafer does not comprise active circuitry.

6. The method of claim 1, wherein the programmable logic device is a switch matrix device or a traffic manager.

7. The method of claim 1, wherein the programmable logic device is a field programmable gate array (FPGA).

8. The method of claim 7, further comprising communicatively coupling, via at least some of the plurality of routing paths formed via hybrid bonding, an application specific integrated circuit (ASIC) to the FPGA.

9. The method of claim 1, wherein the logic components comprise a plurality of multiplexers, a plurality of look-up tables, or a combination thereof.

10. The method of claim 9, wherein the plurality of routing paths determines a multiplexer ratio for one or more of the plurality of multiplexers.

11. The method of claim 1, wherein the logic components and the plurality of routing paths form a logic block, and wherein the method further comprises:
    forming a device layer comprising one or more memory components; and
    communicatively coupling, via hybrid bonding, the logic block to the one or more memory components.

12. The method of claim 11, wherein the logic components of the one or more dies and the memory components of the device layer are in communication through hybrid bond interconnects formed between conductive vias, conductive pads, or combinations thereof.

13. The method of claim 11, wherein the one or more dies and the device layer are face-to-face bonded.

14. The method of claim 1, wherein the one or more dies comprise a first die and a second die disposed in a side-by-side arrangement.

15. The method of claim 14, wherein one or more device components on the first die are communicatively coupled to one or more device components on the second die by at least some of the plurality of routing paths.

16. The method of claim 1, wherein the plurality of routing layers is configured so that at least some of the plurality of routing paths formed by bonding the one or more dies to the wafer are fixed.

17. The method of claim 1, wherein an interconnect density at an interface of the one or more dies and the wafer is within a range of $10^5$–$10^6$ connections/mm$^2$.

18. A method of manufacturing a microelectronic component, the method comprising:
provided one or more dies comprising active circuitry fabricated in a first process node, the active circuitry comprising a plurality of circuit elements among the one or more dies;
providing a wafer comprising one or more routing layers fabricated in a second process node, the first process node being a more advanced node than the second process node; and
direct hybrid bonding the one or more dies to the wafer to interconnect the one or more routing layers with the active circuitry, wherein at least some of the one or more routing layers communicatively couple at least some of the plurality of circuit elements to one another.

19. The method of claim 18, wherein the wafer comprises a first die comprising the routing layers.

20. The method of claim 18, wherein the one or more dies comprises two or more dies in a side-by-side arrangement.

21. The method of claim 20, wherein the two or more dies are hybrid bonded to the wafer in a die-to-wafer hybrid bonding process.

22. The method of claim 18, wherein the one or more dies are hybrid bonded to the wafer, and wherein the method further comprises singulating the microelectronic component from the wafer after hybrid bonding the one or more dies to the wafer.

23. The method of claim 18, wherein the wafer comprises a plurality of input/output (I/O) connectors adapted to communicatively couple the plurality of circuit elements to an external device.

24. The method of claim 19, wherein the first die is a passive die.

25. The method of claim 22, wherein after singulation, a portion of the microelectronic component formed from the wafer has a thickness of less than 50 μm.

26. The method of claim 18, further comprising, after directly hybrid bonding the one or more dies, thinning the one or more dies and bonding an additional layer over the one or more dies.

27. The method of claim 18, further comprising:
providing interconnections on a first side of the wafer, the first side being opposite a second side facing the one or more dies; and
interconnecting the interconnections to an interposer.

28. The method of claim 27, further comprising providing interconnects through the wafer electrically connecting the interconnections to the one or more dies.

29. The method of claim 27, wherein the interconnections comprise pillars.

30. The method of claim 27, wherein the interconnections comprise bumps.

31. The method of claim 18, wherein direct hybrid bonding comprises providing interconnections between the wafer and the one or more dies at a pitch between approximately 1 μm and 10 μm.

32. The method of claim 18, wherein direct hybrid bonding comprises face-to-back bonding.

* * * * *